United States Patent
Kim et al.

(10) Patent No.: US 7,524,757 B2
(45) Date of Patent: Apr. 28, 2009

(54) METHOD FOR MANUFACTURING MULTI-LEVEL TRANSISTOR COMPRISING FORMING SELECTIVE EPITAXIAL GROWTH LAYER

(75) Inventors: Sung-jun Kim, Hwaseong-si (KR); Chang-ki Hong, Seongnam-si (KR); Bo-un Yoon, Seoul (KR); Jae-kwang Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/485,485

(22) Filed: Jul. 13, 2006

(65) Prior Publication Data

US 2007/0045671 A1    Mar. 1, 2007

(30) Foreign Application Priority Data

Aug. 17, 2005   (KR) .................. 10-2005-0075247

(51) Int. Cl.
*H01L 21/4763* (2006.01)

(52) U.S. Cl. .................. 438/634; 438/622; 438/631; 438/637; 438/647; 438/657; 438/674

(58) Field of Classification Search .................. 257/213, 257/774; 438/622, 626, 631, 634, 637, 647, 438/657, 674, 675
See application file for complete search history.

(56) References Cited

U.S. PATENT DOCUMENTS

| | | | |
|---|---|---|---|
| 5,770,482 A | 6/1998 | Kadosh et al. | |
| 6,429,484 B1* | 8/2002 | Yu | 257/347 |
| 7,148,532 B2* | 12/2006 | Nomura et al. | 257/295 |
| 2004/0108558 A1* | 6/2004 | Kwak et al. | 257/410 |
| 2005/0042880 A1* | 2/2005 | Kwok | 438/697 |
| 2005/0164454 A1* | 7/2005 | Leslie | 438/269 |

FOREIGN PATENT DOCUMENTS

| | | |
|---|---|---|
| JP | 05-275652 | 10/1993 |
| KR | 1020020002060 | 1/2002 |

* cited by examiner

*Primary Examiner*—Ori Nadav
(74) *Attorney, Agent, or Firm*—Volentine & Whitt, PLLC

(57) ABSTRACT

A method for manufacturing a multi-level transistor on a substrate. The method includes forming a first transistor on a first active region, forming a first selective epitaxial growth (SEG) layer on the substrate, and forming a preliminary second SEG layer and a dummy layer, wherein the preliminary second SEG layer is formed directly on only the first SEG layer and a portion of the first insulating layer formed on the cell region of the substrate, and wherein the dummy layer is formed on the peripheral region of the substrate. The method further includes planarizing the preliminary second SEG layer using the dummy layer as a stop layer to form a second SEG layer, forming a second active region from the second SEG layer formed on a first insulating layer, and forming a second transistor on the second active region.

9 Claims, 5 Drawing Sheets

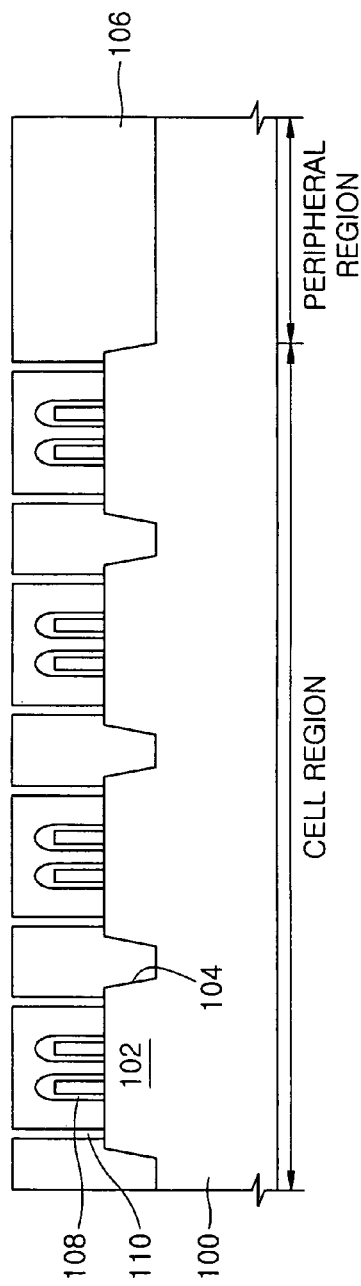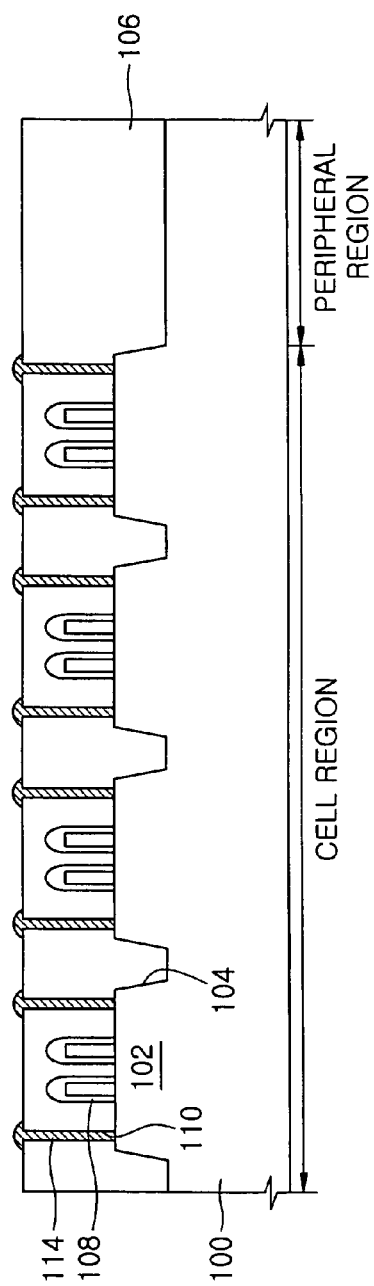

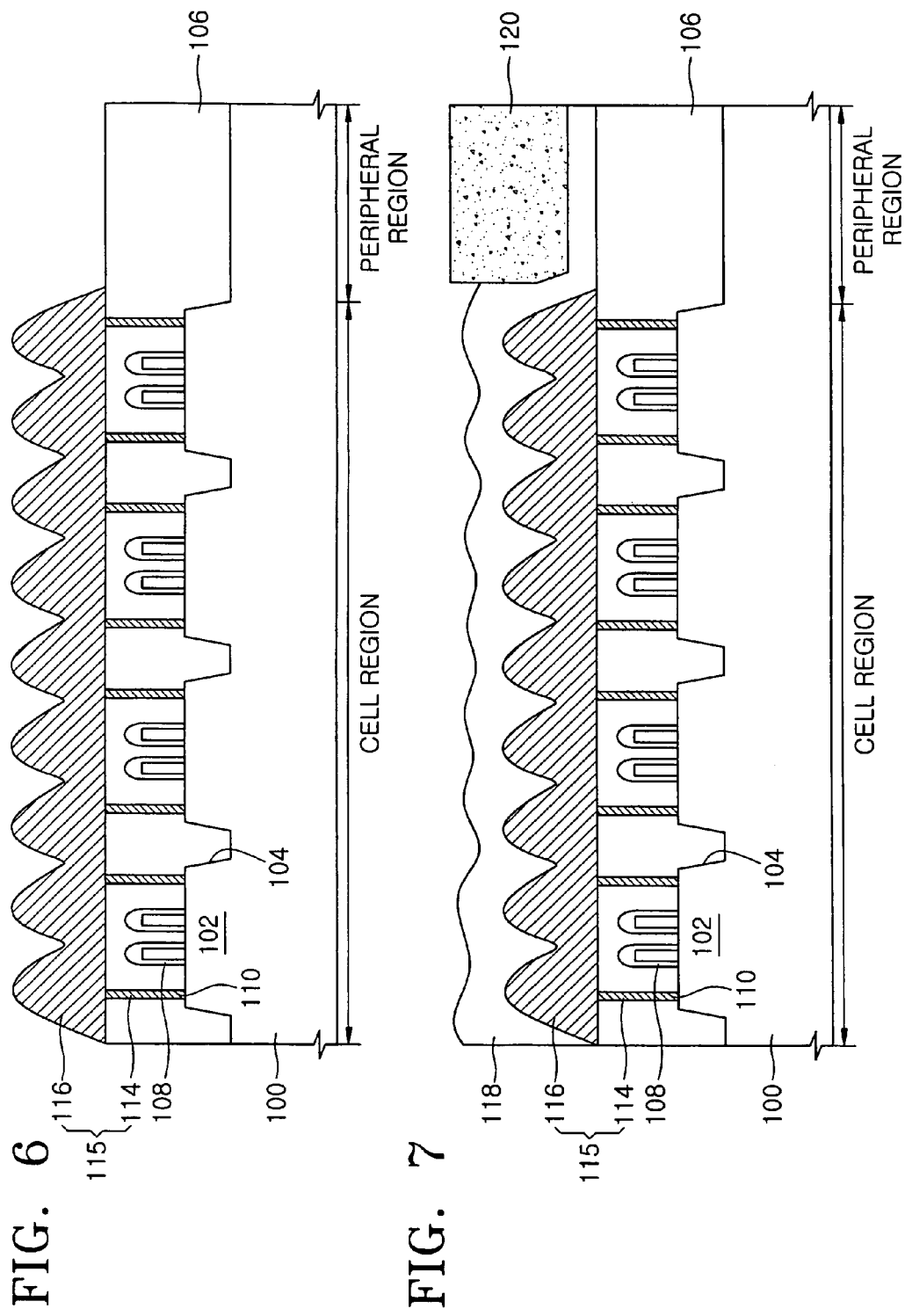

METHOD FOR MANUFACTURING MULTI-LEVEL TRANSISTOR COMPRISING FORMING SELECTIVE EPITAXIAL GROWTH LAYER

BACKGROUND OF THE INVENTION

1. Field of the Invention

Embodiments of the invention relate to a semiconductor device and a method of manufacturing the semiconductor device. In particular, embodiments of the invention relate to a multi-level transistor and a method of manufacturing the multi-level transistor.

This application claims priority to Korean Patent Application No. 10-2005-0075247, filed on Aug. 17, 2005, the subject matter of which is hereby incorporated by reference in its entirety.

2. Description of the Related Art

As semiconductor devices have become more highly integrated, transistor channel lengths have been reduced. Physically reduced channel lengths are known to be related to several problems, including the so-called "short channel effect," minute pattern formation difficulties, and limitations on constituent semiconductor device operating speed. Additionally, an increase in the potential of an electric field near the drain region of a semiconductor device with a relatively short channel length may generate a so-called "punch-through" causing a related drain depletion region to intrude into a potential barrier around a source region. Additionally, thermo-electron emissions impacting a short channel region may incite avalanche breakdown. Further, a vertically disposed electric field across the short channel region may decrease the mobility of channel carriers. The short channel effect noted above typically increases the current level of the constituent transistor when it is OFF, which in turn degrades a refresh characteristic of a memory device incorporating the transistor.

Therefore, a multi-level transistor having an active region comprising at least two levels has been proposed as a solution to the problems described above. In the multi-level transistor, the active region is disposed in three-dimensions, thereby solving some of the problems associated with transistors having physically reduced channel lengths.

FIGS. 1 through 3 are cross-sectional views illustrating a conventional multi-level transistor.

Referring to FIG. 1, a recessed region 14 is formed in a substrate 10, e.g., a silicon substrate, to define a first active region 12. Then, a first transistor 18 is formed on first active region 12. A first insulating layer 16 is then formed covering recessed region 14 and first transistor 18. Next, a contact hole 20 that penetrates through first insulating layer 16 and exposes first active region 12 is formed.

Referring to FIG. 2, amorphous silicon 22 is formed on first insulating layer 16 and fills contact hole 20. A first portion of amorphous silicon 22 disposed on first insulating layer 16 is then patterned to have a defined length. Next, the first portion of amorphous silicon 22 is annealed, then transformed into crystalline silicon to form a second active region 24. Referring to FIG. 3, a second transistor 26 is then formed on second active region 24.

In the conventional multi-level transistor, the first portion of amorphous silicon 22 is crystallized and then used as second active region 24. That is, annealing is performed on the first portion of amorphous silicon 22 and becomes second active region 24 comprising crystalline silicon. However, although the annealing process is precisely controlled, the first portion of amorphous silicon 22 is not completely crystallized, but remains partially unchanged. Thus, less than the entire surface of second active region 24 is evenly crystallized. This uneven crystallization prevents second active region 24 from having the desired single-crystalline characteristic.

SUMMARY OF THE INVENTION

In one embodiment, the invention provides a multi-level transistor comprising; a substrate comprising a first active region, a first transistor disposed on the first active region, a first insulating layer disposed to cover the first transistor and adapted to isolate the first active region, a second active region having a defined area and comprising a patterned first selective epitaxial growth (SEG) layer disposed on the first insulating layer, and a second transistor disposed on the second active region.

In a related aspect, the invention provides a SEG layer disposed in a first contact hole penetrating through the first insulating layer to the substrate and further disposed outside an outer edge of the defined area of the first SEG layer.

In another embodiment, the invention provides a multi-level transistor comprising; a substrate comprising a cell region and a peripheral region, wherein the cell region comprises a first active region, a first transistor disposed on the first active region, a first insulating layer disposed to cover the first transistor and adapted to isolate the first active region, a second active region comprising a patterned selective epitaxial growth (SEG) layer disposed on the first insulating layer, a second transistor formed on the second active region, and a dummy layer disposed on the peripheral region adjacent to the cell region, wherein the dummy layer has an etch selectivity with respect to the SEG layer and a Chemical Mechanical Polishing (CMP) slurry adapted to planarize the dummy layer.

In yet another embodiment, the invention provides a method for manufacturing a multi-level transistor on a substrate having a cell region and a peripheral region, the method comprising; forming a recessed region in the cell region of the substrate to define a first active region, forming a first transistor on the first active region, forming a first insulating layer on the substrate to cover the recessed region and the first transistor, forming a second active region from a selective epitaxial growth (SEG) layer formed on the first insulating layer, and forming a second transistor on the second active region.

In a related aspect, the method further comprises; forming a first contact hole through the first insulating layer to expose a portion of the first active region and wherein forming the second active region comprises; growing a preliminary first SEG layer on the exposed portion of the first active region to fill the first contact hole and at least partially cover an upper surface of the first insulating layer, and thereafter planarizing the preliminary first SEG layer using a Chemical Mechanical Polishing (CMP) process to expose the upper surface of the first insulating layer and thereby form a first SEG layer.

BRIEF DESCRIPTION OF THE DRAWINGS

Exemplary embodiments of the invention will be described herein with reference to the accompanying drawings, in which like reference symbols indicate like or similar elements. In the drawings:

FIGS. 4 through 9 are cross-sectional views illustrating a method of manufacturing a multi-level transistor in accordance with an exemplary embodiment of the present invention; and, FIGS. 10 and 11 are cross-sectional views illustrating a method of manufacturing a multi-level transistor in accordance with another exemplary embodiment of the present invention.

DESCRIPTION OF THE EXEMPLARY EMBODIMENTS

Figure 1:
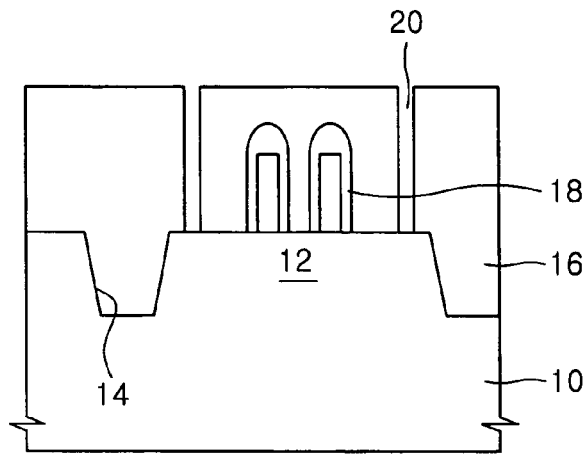
FIGS. 1 through 3 are cross-sectional views illustrating a method of manufacturing a conventional multi-level transistor.
Figure 2:
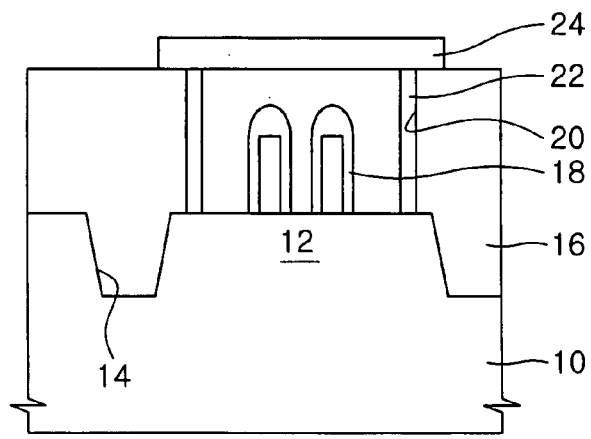
Figure 3:
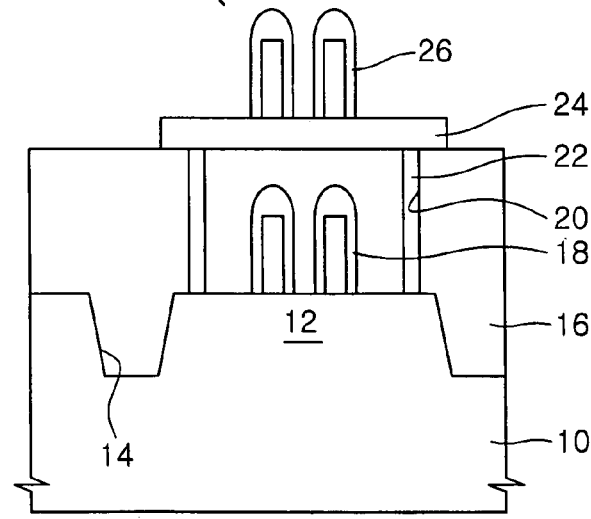

In the drawings, the thicknesses of layers and regions are exaggerated for clarity. Also, when a first layer is referred to as being "on" another layer or substrate, the first layer may be directly on the other layer or substrate, or intervening layers or elements may be present. As used herein, the terms first, second, etc., are used for purposes of description only and do not limit the scope of the invention as defined by the accompanying claims.

Embodiments of the present invention provide a method for forming a second active region having a single-crystalline characteristic. However, when the second active region is planarized, excessive chemical mechanical polishing (CMP) is performed on a peripheral region and an adjacent cell region of a substrate. Therefore, a method for preventing excessive CMP, which is incorporated into the method for forming the multi-level transistor of the present invention, will be described herein.

FIGS. 4 through 9 are cross-sectional views illustrating a method of manufacturing a multi-level transistor in accordance with an exemplary embodiment of the present invention.

Referring to FIG. 4, a recessed region 104 is formed in a substrate 100, e.g., a silicon substrate, to define a first active region 102. When forming first active region 102, a photolithography pattern (not shown) is used to form a mask layer (not shown) comprising a pad oxide layer (not shown) and a pad nitride layer (not shown) on substrate 100. The mask layer is formed on substrate 100 to define recessed region 104 (i.e., the mask layer exposes the region of substrate 100 where recessed region 104 will be formed). The pad oxide layer is formed to reduce stress between substrate 100 and the nitride layer and has a thickness of about 20 to 200 Å, preferably about 100 Å. The nitride layer is used as a hard mask when etching to form recessed region 104, and is formed by depositing silicon nitride to a thickness of about 500 to 2,000 Å, preferably about 800 to 850 Å. The deposition of silicon nitride may be performed using, for example, Chemical Vapor Deposition (CVD), Sub-Atmospheric CVD (SACVD), Low Pressure CVD (LPCVD), or Plasma Enhanced CVD (PECVD).

Subsequently, using the mask layer as an etch mask, substrate 100 is etched using (e.g.), an anisotropic dry etching process to define a depth for recessed region 104. The photoresist pattern is then removed using a conventional method, such as, for example, application of an ashing process using oxygen plasma followed by an organic stripping process. In the illustrated embodiment, recessed region 104 is deep enough to provide device isolation.

Thereafter, first transistor 108 is formed on first active region 102. A first insulating layer 106 is then formed on substrate 100 and covering recessed region 104 and first transistor 108. First insulating layer 106 may be formed from at least one of an HDP oxide layer, a TEOS layer formed using CVD, a silicon oxide layer, an SOG layer, a TEOS layer formed using PECVD, an Si—H based oxide layer, a PECVD layer, a USG layer, or a nitride layer. Of the aforementioned layer types, a HDP oxide layer having a dense film quality may be most suitable for filling recessed region 104 in some embodiments.

HDP CVD is a combination of CVD and etching by sputtering. In HDP CVD, a depositing gas adapted to deposit a material layer and a sputtering gas adapted to etch the deposited material layer by sputtering are both supplied into a chamber. Accordingly, in the illustrated embodiment, $SiH_4$ and $O_2$ a chamber as depositing gases, and inert gas (e.g., Ar gas) is supplied into the chamber as a sputtering gas. The depositing gases and the sputtering gas supplied into the chamber are ionized by plasma incited within the chamber using high frequency electric power. Substrate 100 is mounted on a wafer chuck (e.g., an electrostatic chuck) in the chamber. Biased high frequency electric power is supplied to the wafer chuck, so the ionized depositing gases and sputtering gas are accelerated to a surface of substrate 100. The accelerated depositing gas ions form a silicon oxide layer on substrate 100, and the accelerated sputtering gas ions sputter the deposited silicon oxide layer. Because it is deposited as described above, the HDP oxide layer has a dense film quality and is well-suited for filling gaps (i.e., it has a good gap-filling characteristic). Subsequently, a first contact hole 110 that penetrates through first insulating layer 106 to expose first active region 102 is formed.

Referring to FIG. 5, a preliminary first selective epitaxial growth (SEG) layer 114 is formed. Preliminary first SEG layer 114 fills first contact hole 110 and partially covers first insulating layer 106. Preliminary first SEG layer 114 may be formed, for example, by a Molecular Beam Epitaxy process using $SiCl_4$, $SiHCl_3$, $SiHCl_2$, or $SiH_4$ gas as a source gas. In the illustrated embodiment, an upper surface of first active region 102 is the seed from which preliminary first SEG layer 114 is grown. Because preliminary first SEG layer 114 may be grown in a skewed crystalline orientation relative to the seed layer, the profile of the upper surface of preliminary first SEG layer 114 may be uneven. Accordingly, preliminary first SEG layer 114 should be planarized to give preliminary first SEG layer 114 a uniformly flat upper surface, and thereby form first SEG layer 114.

Figure 8:
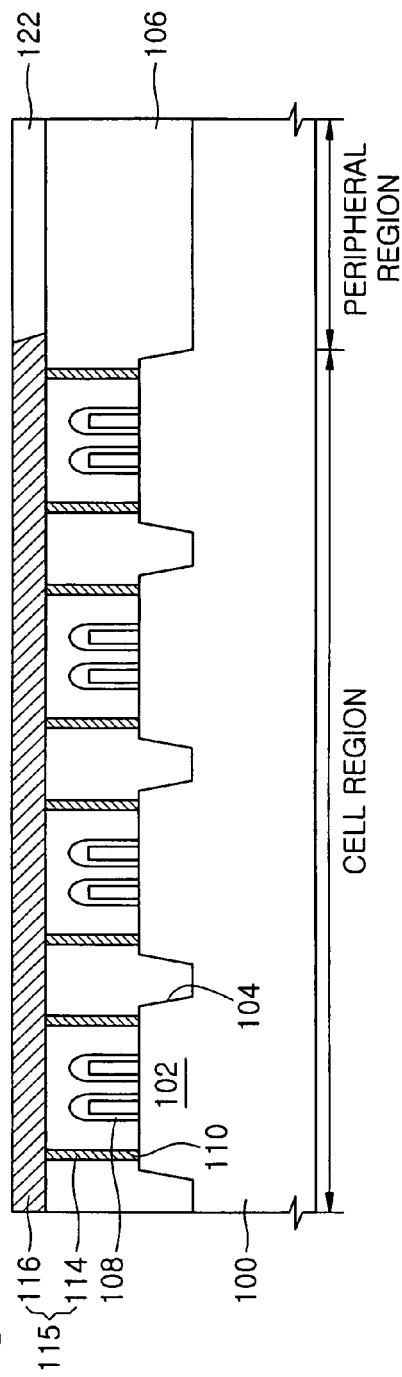

Referring to FIG. 6, first SEG layer 114 is planarized to be even with the upper surface of first insulating layer 106. Thereafter, a preliminary second SEG layer 116 is formed on first insulating layer 106 and first SEG layer 114 in substantially the same manner as preliminary first SEG layer 114 was formed. However, the exposed surface of first SEG layer 114 is used as the seed layer from which preliminary second SEG layer 116 is grown. A third SEG layer 115 comprises first SEG layer 114 and second SEG layer 16, as shown in FIG. 8. In addition, no SEG layer is grown on a peripheral region of substrate 100 because there is no seed from which to grow an SEG layer on the peripheral region. Preliminary second SEG layer 116 will be grown with the same crystalline orientation as the planarized upper surface of first SEG layer 114, so its upper surface may be similarly uneven.

Referring to FIG. 7, a dummy material layer 118 is formed to cover preliminary second SEG layer 116 and the peripheral region. In the illustrated embodiment, dummy material layer 118 is formed from a material having an etch selectivity of about 1:2 to 1:100 with respect to preliminary second SEG layer 116 and CMP slurry. In the illustrated embodiment, the CMP slurry is obtained by adding a polishing material to a liquid-state composite. Generally available polishing material may comprise, for example, colloidal $SiO_2$, fumed $SiO_2$, $Al_2O_3$, $CeO_2$, and $Mn_2O_3$. Also, the liquid-state composite may comprise, for example, viscosity control agents, interface activating agents, pH control agents, chelating agents, and dispersal agents in accordance with the material subjected to CMP. When the etch selectivity is relatively low, dummy material layer 118 is formed with a relatively large thickness. Whereas, when the etch selectivity is relatively high, dummy material layer 118 may be formed with a relatively small thickness.

Dummy material layer 118 may be, for example, a silicon oxide layer, a silicon nitride layer, or a silicon oxide nitride layer. Also, dummy material layer 118 is as thick as or up to twice as thick as a second SEG layer 116 illustrated in FIG. 8. Subsequently, a first photoresist pattern 120 is formed to cover the portion of dummy material layer 118 formed over the peripheral region.

Referring to FIGS. 7 and 8, first photoresist pattern 120 is used as an etch mask in the removal of the portion of dummy material layer 118 formed on preliminary second SEG layer 116. When dummy material layer 118 comprises silicon oxide, it may be removed using, for example, diluted HF, NH$_4$F, or Buffered Oxide Etchant (BOE), which is a mixture of HF and deionized water. Thereafter, to remove first photoresist pattern 120, a conventional method, i.e., ashing using oxygen plasma, is performed on first photoresist pattern 120, which is then removed through organic stripping. A dummy layer 122 is formed on the peripheral region of substrate 100 by removing the portion of dummy material layer 118 formed on preliminary second SEG layer 116 and removing first photoresist pattern 120. Dummy layer 122 is used as a CMP stop layer for the process of planarizing preliminary second SEG layer 116.

The thickness of dummy layer 122 (i.e., completely planarized dummy layer 122) may be greater than or equal to the thickness of second SEG layer 116 (of FIG. 8). That is, the resulting thickness of second SEG layer 116 may be determined in accordance with the thickness of dummy layer 122. Uneven planarization of preliminary second SEG layer 116, which is formed on the cell region adjacent to the peripheral region, can be prevented when preliminary second SEG layer 116 is planarized using dummy layer 122 as a CMP stop layer. If no dummy layer is formed on substrate 100, portions of second SEG layer 116 disposed nearer to the peripheral region will be thinner than those disposed further from the peripheral region because of the height difference between the peripheral region and the cell region. When second SEG layer 116 is formed with an uneven thickness, a second active region 124 will be formed with an uneven thickness as a result, thereby degrading the reliability of the transistor by degrading, for example, the electrical characteristics of the transistor such as the threshold voltage.

Figure 9:
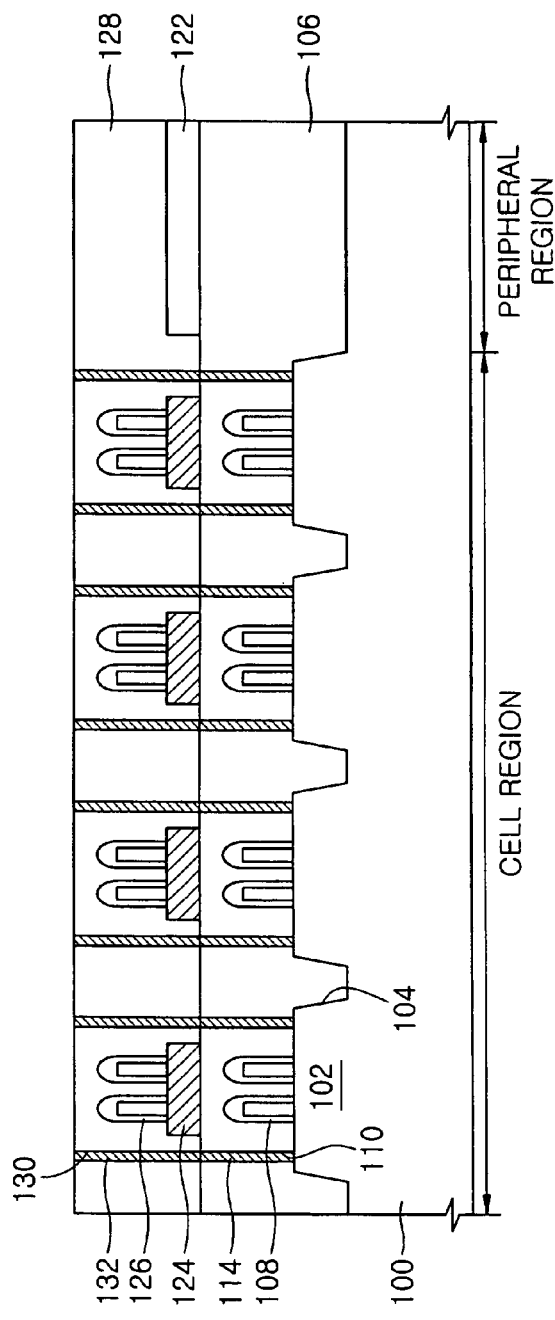

Referring to FIG. 9, second SEG layer 116 is patterned to form second active region 124 having a defined length. Unwanted portions of second SEG layer 116 may be removed using a solution that contains diluted HF and NH$_4$OH, for example. In this manner, second active region 124, which is formed using an SEG process, will exhibit the desired properties of single crystalline silicon. Thereafter, first SEG layer 114, which fills contact hole 110 in first insulating layer 106, may optionally be removed.

A second transistor 126 is then formed on second active region 124 using conventional techniques. A second insulating layer 128 is then formed on first insulating layer 106, second active region 124, and second transistor 126. Second insulating layer 128 is formed to cover second transistor 126 and acts as a device isolation layer for second active region 124. Second insulating layer 128 may be formed from the same materials and through the same methods as first insulating layer 106.

In some embodiments in which first SEG layer 114 is removed, second insulating layer 128 may be used to fill contact hole 110. Subsequently, a second contact hole 130, which is an extension of first contact hole 110 and penetrates through second insulating layer 128 to expose first active region 102, may be filled with a conductive material to thereby form an interconnect contact 132.

Figure 10:
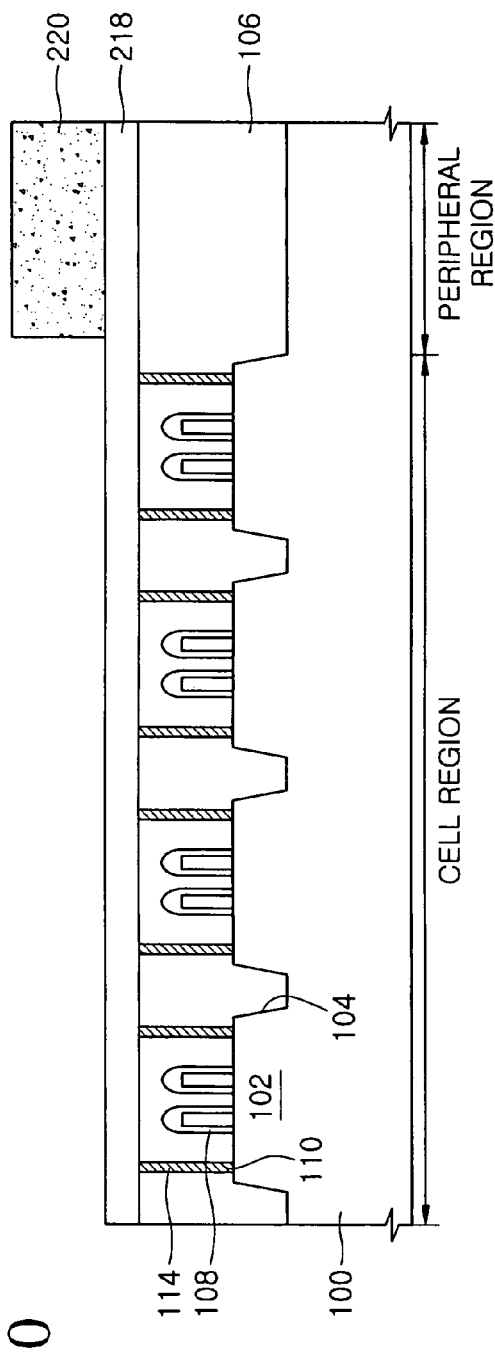
Figure 11:
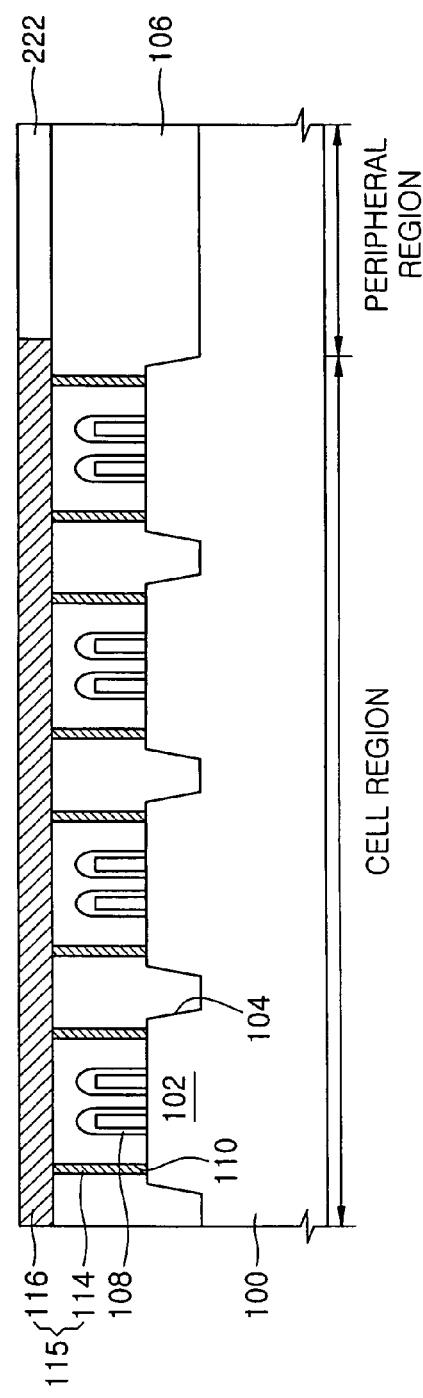

FIGS. 10 and 11 are cross-sectional views illustrating a method for manufacturing a multi-level transistor in accordance with another exemplary embodiment of the present invention. In the illustrated embodiment, the processes for forming the intermediate structure illustrated in FIG. 5 are the same as the corresponding processes described above with reference to FIGS. 4 and 5, and processes performed on the intermediate structure illustrated in FIG. 11 are the same as those described with reference to FIG. 9 and performed on the intermediate structure illustrated in FIG. 8. Thus, further description of those processes will be omitted here.

Referring to FIG. 10, after forming the intermediate structure illustrated in FIG. 5 through the processes described above with reference to FIGS. 4 and 5, preliminary first SEG layer 114 is planarized so that it is level with the upper surface of first insulating layer 106, thereby forming first SEG layer 114. Then, a dummy material layer 218 is formed on first SEG layer 114 and first insulating layer 106. That is, dummy material layer 218 is formed on both the cell region and the peripheral region of substrate 100. Dummy material layer 218 preferably comprises a material that dummy material layer 118 of FIG. 7 comprises. In the illustrated embodiment, dummy material layer 218 has an etch selectivity of about 1:2 to 1:100 with respect to a second SEG layer 116 (of FIG. 11) and the OMP slurry. When the etch selectivity is relatively low, dummy material layer 218 is formed with a relatively large thickness. If the etch selectivity is relatively high, dummy material layer 218 may be formed with a relatively small thickness. In other words, dummy material layer 218 may be as thick as or up to twice as thick as second SEG layer 116 (of FIG. 11). Subsequently, a second photoresist pattern 220 is formed on a portion of dummy material layer 218 formed on the peripheral region of substrate 100.

Referring to FIGS. 10 and 11, dummy material layer 218 is partially removed using second photoresist pattern 220, which does not cover (i.e., exposes) a portion of the upper surface of first insulating layer 106, as an etch mask. The portion of dummy material layer 218 that is removed may be removed using diluted HF, NH$_4$F, or Buffered Oxide Etchant (BOE) which is a mixture of HF and deionized water. Thereafter, a preliminary second SEG layer (not shown), which is like preliminary second SEG layer 116 of FIGS. 6 and 7, is grown on the cell region of substrate 100. Second photoresist pattern 220 is then removed. To remove second photoresist pattern 220, a conventional method, e.g., ashing using oxygen plasma, is performed on second photoresist pattern 220, which is then removed using organic stripping. A dummy layer 222 is formed on the peripheral region of substrate 100 by partially removing dummy material layer 218, as described above, and removing photoresist pattern 220. Using dummy layer 222 as a CMP stop layer, the preliminary second SEG layer is then planarized.

The thickness of dummy layer 222 (i.e., completely planarized dummy layer 222) may be equal to or slightly greater than the thickness of second SEG layer 116. That is, the resulting thickness of second SEG layer 116 may be determined in accordance with the thickness of dummy layer 222. Using dummy layer 222 in the process for planarizing the preliminary SEG layer to form second SEG layer 116 can prevent the preliminary second SEG layer, which is formed on the cell region of substrate 100 adjacent to the peripheral region, from being unevenly planarized. If dummy layer 222 is not formed on substrate 100, portions of second SEG layer 116 disposed nearer to the peripheral region will be thinner than those disposed further from the peripheral region because of the height difference between the peripheral region and the cell region. When second SEG layer 116 is formed with an uneven thickness, second active region 124 will be formed with an uneven thickness as a result, thereby degrading the reliability of the transistor by degrading, for example, the electrical characteristics of the transistor such as the threshold voltage.

In accordance with the multi-level transistor and the method of manufacturing the same as described above, an active region is formed from an SEG layer so that the active region has a single crystalline characteristic.

Furthermore, when planarizing the SEG layer adjacent to a peripheral region, a dummy layer having an etch selectivity with respect to the SEG layer and a CMP slurry is formed on the peripheral region and is used for the planarization of the SEG layer so that an active region formed on a cell region adjacent to the peripheral region will be formed with an even thickness.

While the present invention has been described with reference to exemplary embodiments of the present invention, it will be understood by those of ordinary skill in the art that various changes in form and details may be made to the exemplary embodiments without departing from the scope of the present invention as defined by the accompanying claims.

What is claimed is:

1. A method for manufacturing a multi-level transistor on a substrate having a cell region and a peripheral region, the method comprising:
    forming a recessed region in the cell region of the substrate to define a first active region;
    forming a first transistor on the first active region;
    forming a first insulating layer on the substrate to cover the recessed region and the first transistor;
    forming a first contact hole through the first insulating layer to expose a portion of the first active region;
    growing a preliminary first selective epitaxial growth (SEG) layer on the exposed portion of the first active region to fill the first contact hole and at least partially cover an upper surface of the first insulating layer;
    planarizing the preliminary first SEG layer using a Chemical Mechanical Polishing (CMP) process to expose the upper surface of the first insulating layer to form a first SEG layer on the substrate;
    forming a preliminary second SEG layer on the first SEG layer and the first insulating layer, wherein the preliminary second SEG layer is formed only in the cell region;
    forming a dummy layer on the substrate and only in the peripheral region;
    planarizing the preliminary second SEG layer using the dummy layer as a stop layer to form a second SEG layer;
    forming a second active region from the second SEG layer formed on the first insulating layer; and,
    forming a second transistor on the second active region.

2. The method of claim 1, wherein the preliminary first and second SEG layers are each formed by a Molecular Beam Epitaxy process using at least one of $SiCl_4$, $SiHCl_3$, $SiHCl_2$, and $SiH_4$ as a source gas.

3. The method of claim 1, wherein forming the preliminary second SEG layer further comprises:
    growing the preliminary second SEG layer using an exposed upper surface of the first SEG layer as a seed.

4. The method of claim 1, wherein forming the preliminary second SEG layer and the dummy layer comprises:
    forming the preliminary second SEG layer directly on only the first SEG layer and the portion of the first insulating layer formed on the cell region of the substrate;
    forming a dummy material layer on the substrate to cover the preliminary second SEG layer, wherein the dummy material layer has first and second portions and only the first portion is formed on the preliminary second SEG layer; and
    removing the first portion of the dummy material layer.

5. The method of claim 4, wherein removing the first portion of the dummy material layer comprises:
    forming a photoresist pattern on the second portion of the dummy material layer in the peripheral region of the substrate;
    removing the first portion of the dummy material layer using the photoresist pattern as an etch mask; and,
    removing the photoresist pattern.

6. The method of claim 4, wherein the dummy material layer has a thickness ranging up to twice as thick as the second SEG layer.

7. The method of claim 1, wherein planarizing the preliminary second SEG layer using the dummy layer as a stop layer comprises planarizing the preliminary second SEG layer using a CMP process and using the dummy layer as a CMP stop layer.

8. The method of claim 7, wherein forming the preliminary second SEG layer comprises growing the preliminary second SEG layer using the first SEG layer as a seed.

9. The method of claim 7, wherein the dummy layer has an etch selectivity ranging from between about of 1:2 to 1:100 with respect to the preliminary second SEG layer and a slurry adapted for use with the CMP process.

* * * * *